(12) United States Patent
Gowda et al.

(10) Patent No.: US 9,171,785 B2
(45) Date of Patent: Oct. 27, 2015

(54) POWER OVERLAY STRUCTURE WITH LEADFRAME CONNECTIONS

(71) Applicant: General Electric Company, Schenectady, NY (US)

(72) Inventors: Arun Virupaksha Gowda, Rexford, NY (US); Paul Alan McConnelee, Albany, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 14/165,725

(22) Filed: Jan. 28, 2014

(65) Prior Publication Data
US 2014/0138807 A1    May 22, 2014

Related U.S. Application Data

(63) Continuation of application No. 13/211,057, filed on Aug. 16, 2011, now Pat. No. 8,653,635.

(51) Int. Cl.
*H01L 23/495* (2006.01)
*H01L 23/373* (2006.01)
(Continued)

(52) U.S. Cl.
CPC .............. *H01L 23/495* (2013.01); *H01L 21/50* (2013.01); *H01L 23/3735* (2013.01); *H01L 23/49531* (2013.01); *H01L 23/49575* (2013.01); *H01L 23/49811* (2013.01); *H01L 24/24* (2013.01); *H01L 24/82* (2013.01); *H01L 25/072* (2013.01); *H01L 24/29* (2013.01); *H01L 24/83* (2013.01); *H01L 2224/24137* (2013.01); *H01L 2224/24226* (2013.01); *H01L 2224/24246* (2013.01); *H01L 2224/29101* (2013.01); *H01L 2224/29339* (2013.01); *H01L 2224/32225* (2013.01); *H01L 2224/32245* (2013.01); *H01L 2224/48* (2013.01); *H01L 2224/73217* (2013.01);
(Continued)

(58) Field of Classification Search
CPC ..................... H01L 23/3735; H01L 23/49531; H01L 23/49575; H01L 23/49811; H01L 24/24; H01L 25/072; H01L 23/495; H01L 24/83; H01L 2924/19105; H01L 2924/00014; H01L 2924/19041
USPC .......... 257/666, 672, 676, E33.066, E27.155, 257/E23.031, E23.141, E21.523, E23.042, 257/E23.043, E23.045, E23.049, E23.05, 257/E23.052, E23.054, E23.056, E23.057, 257/E23.058, E23.06, E23.066
See application file for complete search history.

(56) References Cited

U.S. PATENT DOCUMENTS 5,315,486 A * 5/1994 Fillion et al. .................. 361/795
5,888,884 A * 3/1999 Wojnarowski ................ 438/462
(Continued)

*Primary Examiner* — Yosef Gebreyesus
(74) *Attorney, Agent, or Firm* — Ziolkowski Patent Solutions Group, SC; Jean K. Testa

(57) ABSTRACT

A power overlay (POL) packaging structure that incorporates a leadframe connection is disclosed. The a POL structure includes a POL sub-module having a dielectric layer, at least one semiconductor device attached to the dielectric layer and that includes a substrate composed of a semiconductor material and a plurality of connection pads formed on the substrate, and a metal interconnect structure electrically coupled to the plurality of connection pads of the at least one semiconductor device, with the metal interconnect structure extending through vias formed through the dielectric layer so as to be connected to the plurality of connection pads. The POL structure also includes a leadframe electrically coupled to the POL sub-module, with the leadframe comprising leads configured to make an interconnection to an external circuit structure.

12 Claims, 4 Drawing Sheets

(51) Int. Cl.
*H01L 23/498* (2006.01)
*H01L 23/00* (2006.01)
*H01L 25/07* (2006.01)
*H01L 21/50* (2006.01)

(52) U.S. Cl.
CPC ............... *H01L 2224/73267* (2013.01); *H01L 2224/8384* (2013.01); *H01L 2224/8385* (2013.01); *H01L 2224/83192* (2013.01); *H01L 2224/83424* (2013.01); *H01L 2224/83447* (2013.01); *H01L 2224/83801* (2013.01); *H01L 2224/83855* (2013.01); *H01L 2224/92144* (2013.01); *H01L 2924/01029* (2013.01); *H01L 2924/1203* (2013.01); *H01L 2924/16152* (2013.01); *H01L 2924/19105* (2013.01)

(56) References Cited

U.S. PATENT DOCUMENTS

| | | | |
|---|---|---|---|
| 6,232,151 B1 | 5/2001 | Ozmat et al. | |
| 6,306,680 B1 | 10/2001 | Fillion et al. | |
| 6,377,461 B1 | 4/2002 | Ozmat et al. | |
| 7,262,444 B2 | 8/2007 | Fillion et al. | |
| 8,409,922 B2* | 4/2013 | Camacho et al. | 438/109 |
| 8,581,416 B2* | 11/2013 | Massie et al. | 257/775 |
| 2001/0023983 A1 | 9/2001 | Kobayashi et al. | |
| 2002/0167062 A1 | 11/2002 | Narita | |
| 2006/0018607 A1* | 1/2006 | Rosenberg | 385/92 |
| 2006/0151860 A1* | 7/2006 | Islam et al. | 257/676 |
| 2006/0166397 A1* | 7/2006 | Lau et al. | 438/106 |
| 2007/0035033 A1* | 2/2007 | Ozguz et al. | 257/777 |
| 2007/0138651 A1 | 6/2007 | Hauenstein | |
| 2007/0145547 A1 | 6/2007 | McKerreghan et al. | |
| 2007/0257343 A1 | 11/2007 | Hauenstein et al. | |
| 2007/0262436 A1* | 11/2007 | Kweon et al. | 257/686 |
| 2008/0006936 A1 | 1/2008 | Hsu | |
| 2009/0207574 A1 | 8/2009 | Chen et al. | |
| 2009/0291296 A1* | 11/2009 | McConnelee et al. | 428/336 |
| 2010/0244225 A1* | 9/2010 | Sabatini et al. | 257/692 |
| 2011/0291249 A1* | 12/2011 | Chi et al. | 257/675 |
| 2012/0270354 A1* | 10/2012 | Hooper et al. | 438/51 |

* cited by examiner

POWER OVERLAY STRUCTURE WITH LEADFRAME CONNECTIONS

CROSS-REFERENCE TO RELATED APPLICATION

The present application is a continuation of, and claims priority to, U.S. patent application Ser. No. 13/211,057, filed Aug. 16, 2011, the disclosure of which is incorporated herein by reference.

BACKGROUND OF THE INVENTION

Embodiments of the invention relate generally to structures and methods for packaging semiconductor devices and, more particularly, to a power overlay (POL) packaging structure that incorporates a leadframe connection therein.

Power semiconductor devices are semiconductor devices used as switches or rectifiers in power electronic circuits, such as switched mode power supplies, for example. Most power semiconductor devices are only used in commutation mode (i.e., they are either on or off), and are therefore optimized for this. Many power semiconductor devices are used in high voltage power applications and are designed to carry a large amount of current and support a large voltage. In use, high voltage power semiconductor devices are connected to an external circuit by way of a power overlay (POL) packaging and interconnect system, with the POL package also providing a way to remove the heat generated by the device and protect the device from the external environment.

A standard POL package manufacturing process typically begins with placement of one or more power semiconductor devices onto a dielectric layer by way of an adhesive. Metal interconnects (e.g., copper interconnects) are then electroplated onto the dielectric layer to form a direct metallic connection to the power semiconductor device(s). The metal interconnects may be in the form of a low profile (e.g., less than 200 micrometers thick), planar interconnect structure that provides for formation of an input/output (I/O) system to and from the power semiconductor device(s).

For connecting to an external circuit, such as by making a second level interconnection to a printed circuit board for example, current POL packages use solder ball grid arrays (BGAs) or land grid arrays (LGAs). While the short stand-off height (~5 to 20 mils) of these types of interconnections provides a low profile, such connections are susceptible to early failure in high stress conditions. That is, very large temperature cycling ranges, shock, and vibration can induce failures in these solder joints.

Therefore, it would be desirable to provide a POL package having interconnections that are resistive to failure in high stress conditions, so as to enhance interconnection reliability. It would further be desirable for such a POL package to provide such reliability while minimizing cost of the POL package.

BRIEF DESCRIPTION OF THE INVENTION

Embodiments of the invention overcome the aforementioned drawbacks by providing a semiconductor device package structure that eliminates the usage of solder ball grid arrays (BGAs) or land grid arrays (LGAs) to connect the POL package to an external circuit. A leadframe connection is provided for the POL package to provide a highly reliable interconnection structure usable in a variety of high stress environments.

In accordance with one aspect of the invention, a power overlay (POL) structure includes a POL sub-module, with the POL sub-module further including a dielectric layer, at least one semiconductor device attached to the dielectric layer that includes a substrate composed of a semiconductor material and a plurality of connection pads formed on the substrate, and a metal interconnect structure electrically coupled to the plurality of connection pads of the at least one semiconductor device, with the metal interconnect structure extending through vias formed through the dielectric layer so as to be connected to the plurality of connection pads. The POL structure also includes a leadframe electrically coupled to the POL sub-module, with the leadframe comprising leads configured to make an interconnection to an external circuit structure.

In accordance with another aspect of the invention, a power overlay (POL) packaging structure includes a POL sub-module having a dielectric layer, at least one semiconductor device attached to the dielectric layer and including a substrate composed of a semiconductor material and a plurality of connection pads formed on the substrate, and a first level interconnect structure electrically coupled to the plurality of connection pads of the at least one semiconductor device, with the first level interconnect structure extending through vias formed through the dielectric layer so as to be connected to the plurality of connection pads. The POL packaging structure also includes a second level interconnect structure to electrically couple the POL sub-module to an external circuit structure, the second level interconnect structure comprising a leadframe configured to make an interconnection to the external circuit structure.

In accordance with yet another aspect of the invention, a method of forming a power overlay (POL) structure includes providing a POL sub-module including a dielectric layer, at least one semiconductor device attached to the dielectric layer, and a metallic interconnect structure extending through vias in the dielectric layer to electrically connect to the at least one semiconductor device. The method also includes providing a leadframe for the POL sub-module that is configured to make an interconnection between the POL sub-module and an external circuit structure, wherein the leadframe is electrically coupled to the POL sub-module based on one of a direct attachment of the leadframe to the POL sub-module and an attachment of the leadframe to a direct bond copper (DBC) substrate positioned between the POL sub-module and the leadframe. The method further includes encapsulating the POL sub-module and a portion of the leadframe with a polymeric material to provide structural rigidity to the POL structure.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION

Embodiments of the present invention provide for a semiconductor device package having leadframe connections incorporated therein, as well as a method of forming such a semiconductor device package. The semiconductor device package is manufactured such that the leadframe connections form a highly reliable interconnection structure, usable in a variety of high stress environments, for attaching the semiconductor device package to an external circuit.

Figure 1:
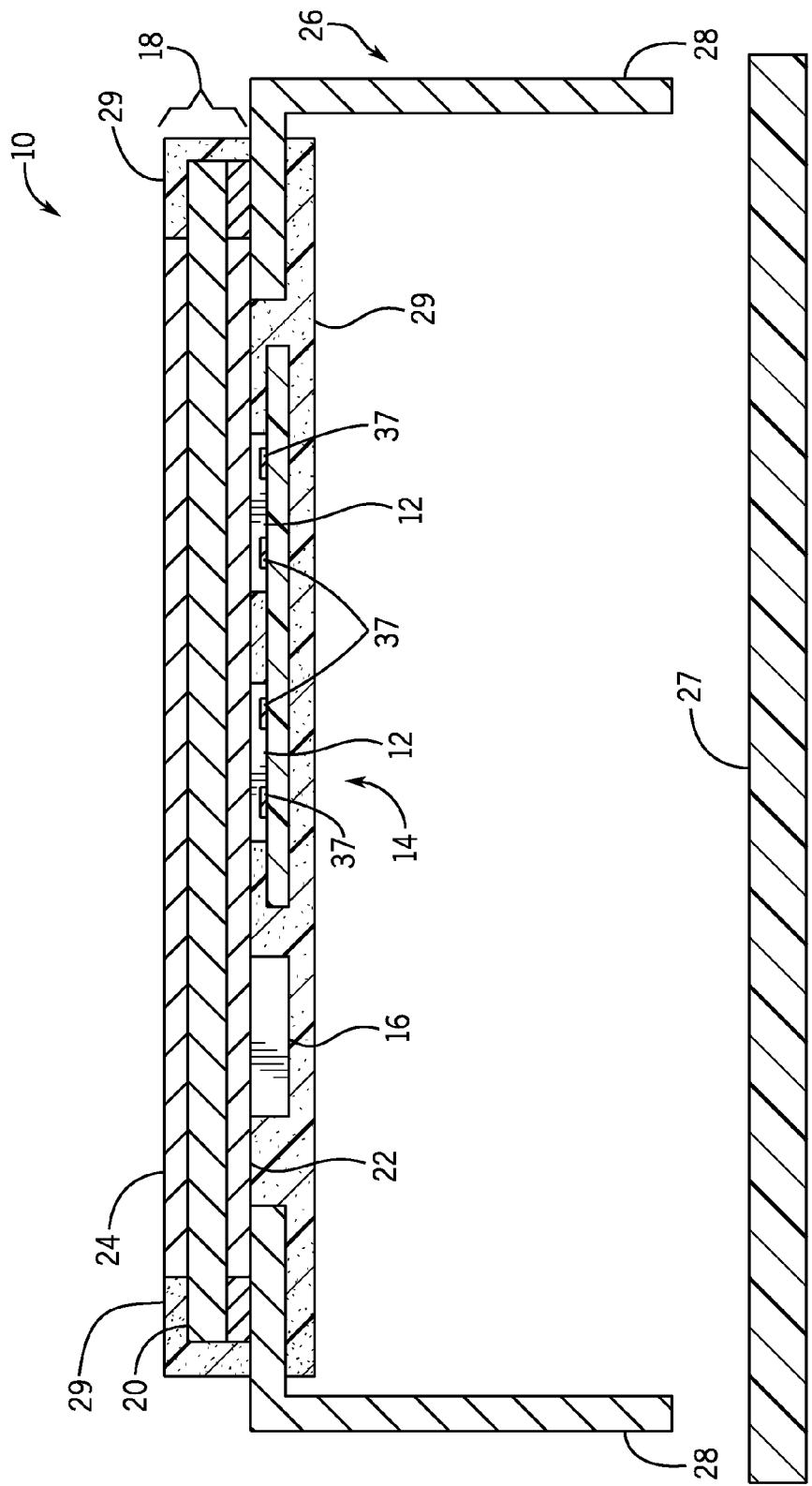
FIG. 1 is a schematic cross-sectional side view of a power overlay (POL) structure according to an embodiment of the invention.

Referring to FIG. 1, a power overlay (POL) packaging and interconnect structure 10 is shown according to an embodiment of the invention. The POL structure 10 includes one or more semiconductor device(s) 12 therein that, according to various embodiments, may be in the form of a die, diode, or other power electronic device. As shown in FIG. 1, two semiconductor device(s) 12 are provided in POL structure 10, however, it is recognized that a greater or lesser number of semiconductor devices 12 could be included in POL structure 10. The semiconductor device(s) 12 are packaged within a POL sub-module 14 that, as will be explained in greater detail below, forms a direct metallic connection to the power semiconductor device(s) 12, with the connection being in the form of a low profile, planar interconnect structure, for example, that provides for formation of an input/output (I/O) system to and from the power semiconductor device(s) 12. According to one embodiment of the invention, a passive device/component 16 such as a resistor, a capacitor, or an inductor, is also included in POL structure 10.

As shown in FIG. 1, POL structure 10 also includes a direct bond copper (DBC) substrate 18 or another similar substrate to which POL sub-module 14 and passive device 16 are attached. The DBC substrate 18 is composed of a ceramic tile (e.g., alumina) 20 with a sheet of copper 22, 24 bonded to both sides thereof by a high-temperature joining process. According to embodiments of the invention, different brazing and direct bond technologies may be employed based on, for example, whether substrate 18 is composed of alumina or aluminum nitride and silicon nitride, etc. Both sides of DBC 18 are then typically etched after firing. The bottom copper layer 24 on the backside of the DBC substrate 18 is left fully or partially exposed to provide efficient heat transfer out from the POL structure 10. While referred to above and here below as a "DBC substrate," it is recognized that aluminum can be used instead of copper as the metal layer, and thus such an embodiment is considered within the scope of the invention. Thus, use of the term "DBC substrate" herebelow is meant to encompass a structure 18 that includes a ceramic tile (e.g., alumina) 20 with a sheet of any suitable metallic material 22, 24 (such as copper or aluminum) bonded to both sides thereof.

As further shown in FIG. 1, the DBC substrate 18 includes a leadframe 26 attached thereto. According to embodiments of the invention, the leadframe 26 is pre-attached to the DBC substrate 18 prior to placement of the POL sub-module 14 thereon, such as by way of high temperature joining process like soldering, brazing, welding, or other similar method, although it is recognized that leadframe 26 could be post-attached instead (depending on the solder materials used), according to another embodiment of the invention. After attachment to the DBC substrate 18, the leadframe 26 is subsequently cut and formed to enable surface mounting of the POL structure 10 to an external circuit such as a printed circuit board (PCB) 27. The leadframe 26 is formed to include a number of leads 28 that are configured to be attached/affixed to the PCB to electrically couple the POL structure 10 to the PCB. The leadframe 26 provides a highly reliable interconnection structure that is resistive to failure in high stress conditions, such as an automotive environment that experiences temperature cycling ranges, shock, and vibration. A polymeric underfill or encapsulate or overmold 29 is provided on POL structure 10 that encapsulates the top of the POL sub-module 14 and the area of leadframe 26 connected to the DBC substrate 18 and fills in gaps in the POL structure 10, so as to provide additional structural integrity to POL structure 10. According to one embodiment, encapsulate 29 is also applied to at least a portion of a back surface of the DBC substrate 18.

While POL structure 10 is shown in FIG. 1 as including a DBC substrate 18 having a leadframe 26 attached thereto, it is recognized that additional embodiments of the invention are envisioned that do not include a DBC substrate 18. That is, according to additional embodiments of the invention, a leadframe 26 is provided that is attached directly to a POL sub-module 14, with the POL sub-module 14 being overmolded or encapsulated upon attaching to the leadframe 26. The leadframe 26 is thus designed suitably to allow the routing and incorporation of the POL sub-module 14.

Figure 2:
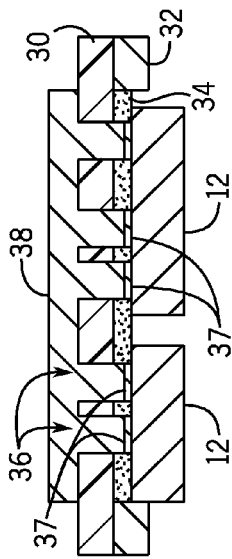
FIGS. 2-13 are schematic cross-sectional side views of a POL structure during various stages of a manufacturing/build-up process according to an embodiment of the invention.

Referring now to FIGS. 2-12, detailed views of the process steps for a technique of manufacturing the POL structure 10 of FIG. 1 are provided, according to an embodiment of the invention. As shown first in FIGS. 2-9, process steps for a build-up of the POL sub-module 14 are provided. Referring to FIG. 2, the build-up process of POL sub-module 14 begins with the placement and attachment of a dielectric layer 30 onto a frame structure 32. The dielectric layer 30 is in the form of a lamination or film and is placed on frame structure 32 to provide stability during the build-up process of POL sub-module 14. According to embodiments of the invention, the dielectric layer 30 may be formed of one a plurality of dielectric materials, such as Kapton®, Ultem®, polytetrafluoroethylene (PTFE), Upilex®, polysulfone materials (e.g., Udel®, Radel®), or another polymer film, such as a liquid crystal polymer (LCP) or a polyimide material.

Figure 3:
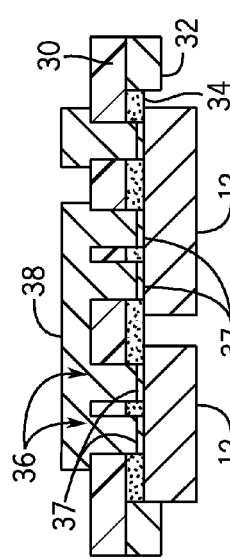
Figure 4:
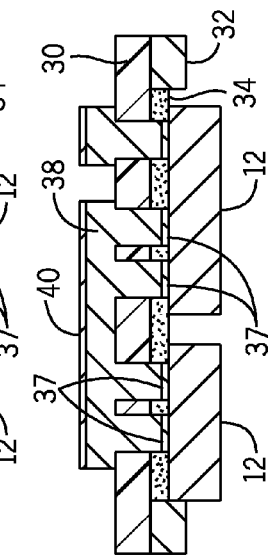
Figure 5:
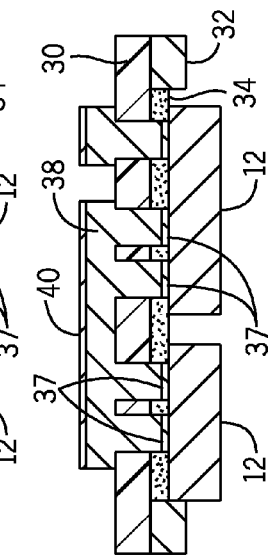

As shown in FIG. 3, upon securing of dielectric layer 30 to frame structure 32, an adhesive layer 34 is deposited onto dielectric layer 30. A plurality of vias 36 is then formed through the adhesive layer 34 and dielectric lamination 42, as illustrated in FIG. 4. According to embodiments of the invention, the vias 36 may be formed by way of a laser ablation or laser drilling process, plasma etching, photo-definition, or mechanical drilling processes. In a next step of technique, one or more semiconductor devices 12 are secured to dielectric layer 30 by way of adhesive layer 34, as illustrated in FIG. 5. To secure the semiconductor devices 12 to dielectric layer 30, the semiconductor devices 12 are placed onto adhesive layer 34 and the adhesive 34 is then cured to secure the semiconductor device 12 on the dielectric layer 30.

While the formation of vias 36 through adhesive layer 34 and dielectric lamination 30 is shown in FIG. 4 as being performed prior to placement of semiconductor devices 12 onto adhesive layer 34, it is recognized that the placement of semiconductor devices 12 could occur prior to via formation. That is, depending on constraints imposed by via size, semiconductor devices 12 could first be placed on adhesive layer 34 and dielectric layer 30, with the vias 36 subsequently being formed at locations corresponding to a plurality of metalized circuits and/or connection pads 37 formed on semiconductor devices 12. Furthermore, a combination of pre- and post-drilled vias could be employed as needed.

Figure 6:
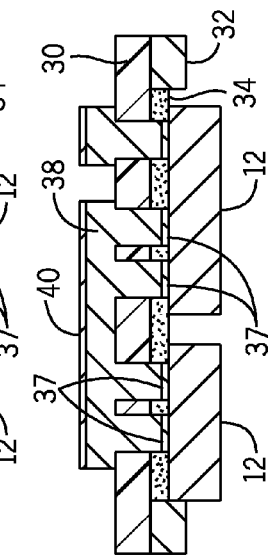
Figure 7:
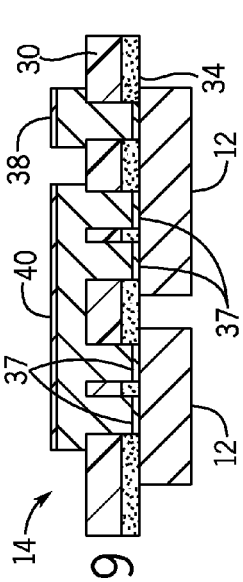
Figure 8:
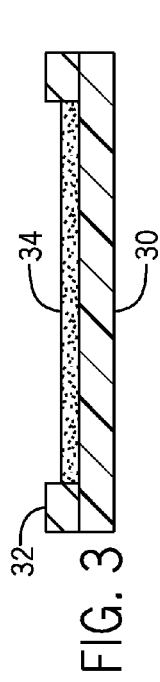

Referring now to FIGS. 6 and 7, upon securing of semiconductor devices 12 on the dielectric layer 30 and the formation of vias 36, the vias 36 are cleaned (such as through a reactive ion etching (RIE) desoot process) and subsequently metalized to form interconnects 38. The metal interconnects 38 are typically formed through a combination of sputtering and electroplating applications, although it is recognized that other electroless methods of metal deposition could also be used. For example, a titanium adhesion layer and copper seed layer may first be applied via a sputtering process, followed by an electroplating process that increases a thickness of the copper to a desired level. The applied metal material is then subsequently patterned into metal interconnects 38 (i.e., first level interconnects) having a desired shape and that function as vertical feed-throughs formed through dielectric layer 30 and adhesive layer 34. As shown in FIG. 6, according to one embodiment, metal interconnects 38 form direct metallic and electrical connections to circuits/connection pads 37 on semiconductor devices 12 and that electrically connect the two semiconductor devices 12. The metal interconnects 38 extend out from circuits and/or connection pads 37 of semiconductor devices 12, through vias/opening 36, and out across a top surface of dielectric layer 30. As shown in FIG. 8, a solder mask layer 40 is applied over the patterned metal interconnects 38 to provide a protective coating for the copper shims thereof. It is recognized, however, that according to other embodiments of the invention, solder mask layer 40 need not be applied. That is, solder mask layer 40 is only needed if there is a plan to subsequently solder or leave that surface of POL sub-module 14 open. Additionally, the layer 40 could be composed of some metal material other than solder, such as Ni or Ni/Au, or bare copper which can then be encapsulated.

Figure 9:
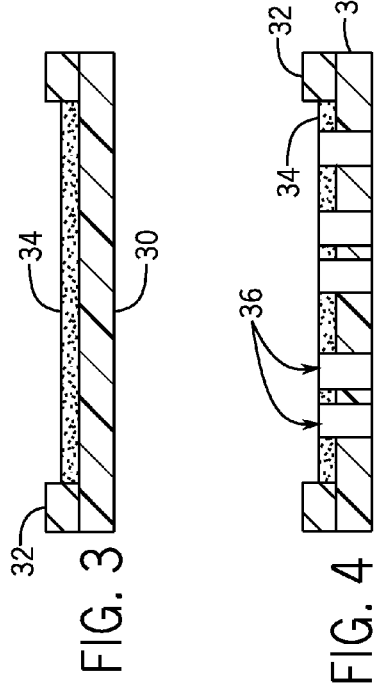

In completing the build-up of POL sub-module 14, the POL sub-module 14 is singulated and removed from frame structure 32, as illustrated in FIG. 9. A completed POL sub-module 14 is thus provided that includes semiconductor devices 12, and metal interconnects 38 that function as metal vertical feed-throughs and top side interconnects. The POL sub-module 14 is handled as a component or multi-chip module. According to one embodiment, copper shims may also be provided in POL sub-module 14 and used as an electrical short. The copper shims are used like the semiconductor die 12 but are made of copper or a similar material. Ceramics like Alumina or aluminum nitride could also be used to provide mechanical support or act as a thermal conduit.

Figure 10:
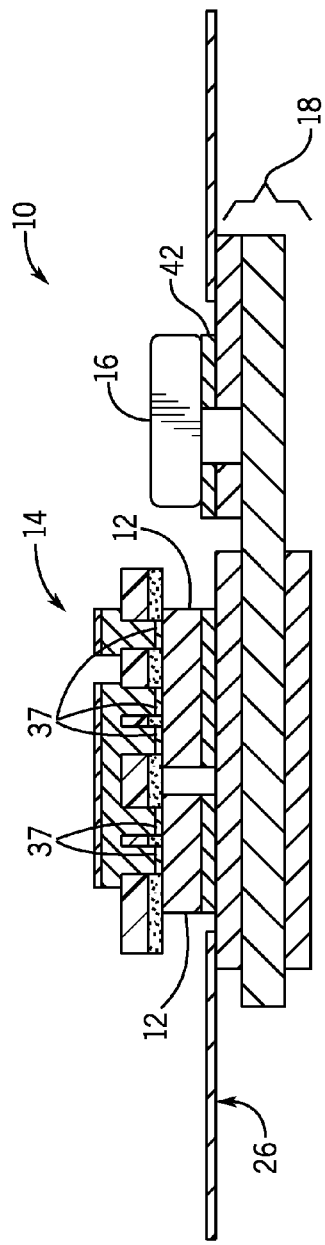

Referring now to FIG. 10, the technique of manufacturing POL structure 10 continues with the attaching of POL sub-module 14 and semiconductor devices 12 to a direct bond copper (DBC) substrate 18, according to one embodiment of the invention. As shown in FIG. 10, POL sub-module 14 is attached to DBC substrate 18 by way of a solder material 42, so as to secure the POL sub-module 14 and DBC substrate 18 together. According to one embodiment, a passive device/component 16 such as a resistor, a capacitor, or an inductor, is also solder attached to DBC substrate 18.

As further shown in FIG. 10, the DBC substrate 18 includes a leadframe 26 attached thereto. The leadframe 26 can be pre-attached to DBC substrate 18 prior to attachment of the POL sub-module 14 (and passive device 16), or post-attached, i.e., after attachment of POL sub-module 14 to DBC substrate 18. According to embodiments of the invention, the leadframe 26 is pre-attached to the DBC substrate 18 by way of high temperature joining process such as soldering, brazing, welding, or another suitable method. A polymeric underfill or encapsulate 44 (e.g., epoxy) is provided on POL structure 10 that encapsulates the POL sub-module 14 and the portion of leadframe 26 connected to the DBC substrate 18.

Figure 11:
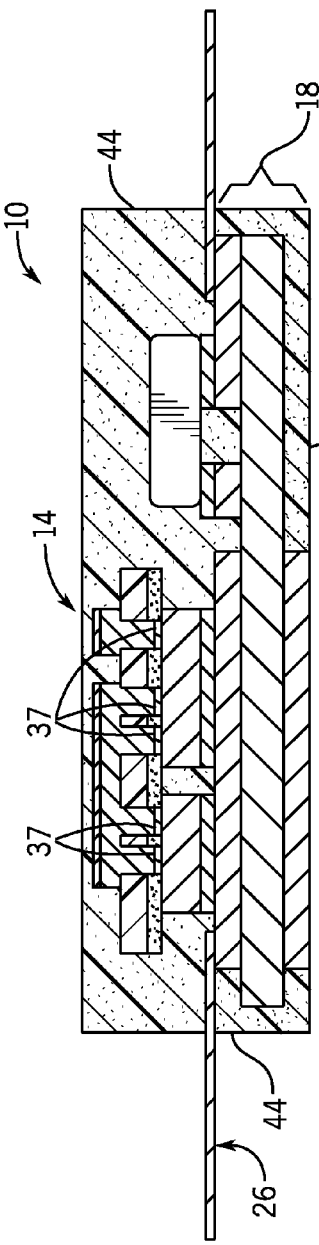

The polymeric underfill/encapsulate 44 also fills in gaps in the POL structure 10, as shown in FIG. 11, so as to provide additional structural integrity to the POL structure 10. According to one embodiment, encapsulate 44 is also applied to at least a portion of a back surface of the DBC substrate 18, on ceramic tile 20.

Figure 12:
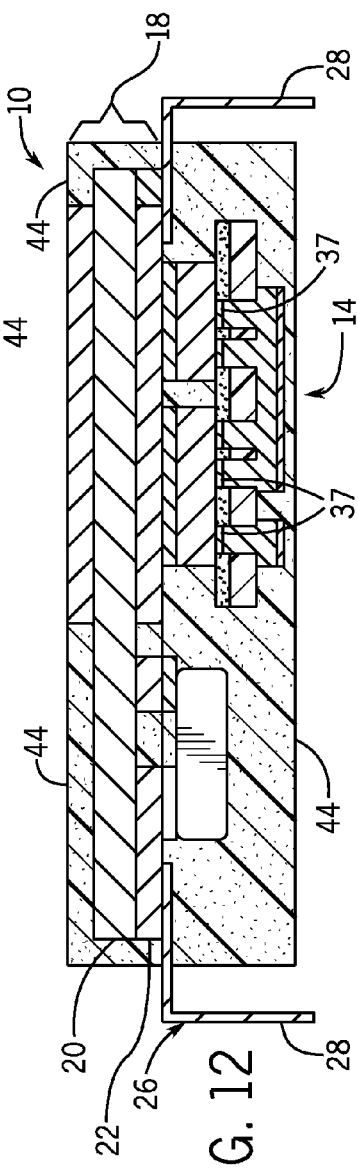

As shown in FIG. 12, upon encapsulating the POL sub-module 14 with epoxy 44, the leadframe 26 is subsequently cut and formed to enable surface mounting of the POL structure 10 to an external circuit, such as a PCB (not shown). The leadframe 26 is cut/formed to include a number of leads 28 that are configured to be attached/affixed to the PCB to electrically couple the POL structure 10 to the PCB, such that the leadframe 26 forms a second level interconnect for POL structure 10. As can be seen in FIG. 12, leadframe 26 is electrically coupled to POL sub-module 14 by way of top copper layer 22, such that an interconnect can be made between POL sub-module 14 and the PCB. Beneficially, the leadframe 26 provides a highly reliable interconnection structure that is resistive to failure in high stress conditions.

Figure 13:
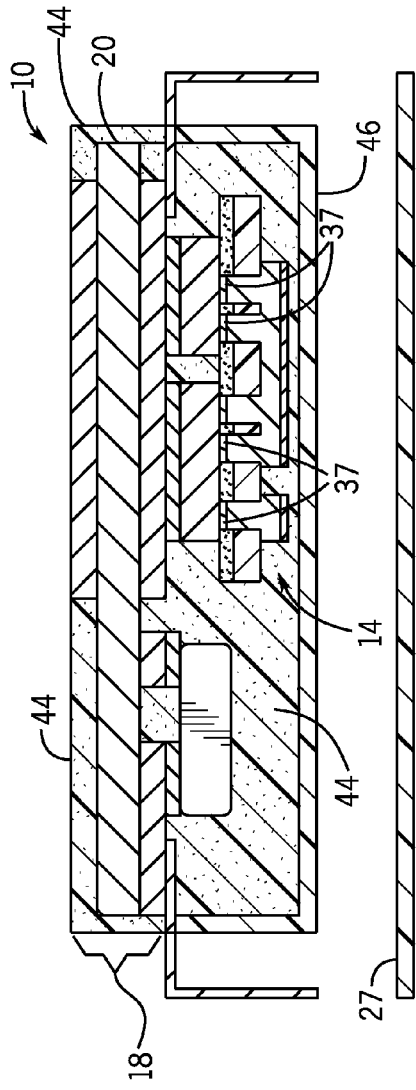

Referring now to FIG. 13, according to one embodiment of the invention, the process of manufacturing the POL structure 10 continues with positioning and securing of a cap 46 about POL sub-module 14 of POL structure 10. Specifically, cap 46 is formed about and secured to DBC substrate and may or may not then be filled with polymer before sealing. According to embodiments of the invention, cap 46 may be in the form of a hermetic cap or a non-hermetic cap. When cap 46 is a hermetic cap, as DBC substrate 18 is itself a hermetic structure based on the inclusion of ceramic tile 20 therein, the hermetic cap 46 combines with DBC substrate 18 to hermetically seal POL sub-module 14 from the external environment. Such hermetic sealing is beneficial in high stress environments and conditions, such as an automotive environment that experiences temperature cycling ranges, shock, and vibration. In another embodiment, the cap 46 could be a non-hermetic plastic enclosure that is attached to the DBC substrate 18 and filled with polymer to avoid the use of a mold. The cap/lid 46 may possess fill holes through which the polymer can be applied and then sealed.

Beneficially, the POL structure 10 formed according to the process steps illustrated in FIGS. 2-13 is constructed such that all connections are brought to the DBC substrate plane (as compared to the prior art where connections are brought to the POL copper plane) and such that the leadframe 26 is attached to the DBC substrate 18, thereby increasing the reliability of POL structure 10. POL structure 10 also provides for the attachment of passives 16 outside the POL sub-module 14, allowing for the use of standard passives and smaller POL sub-modules 14.

Figure 14:
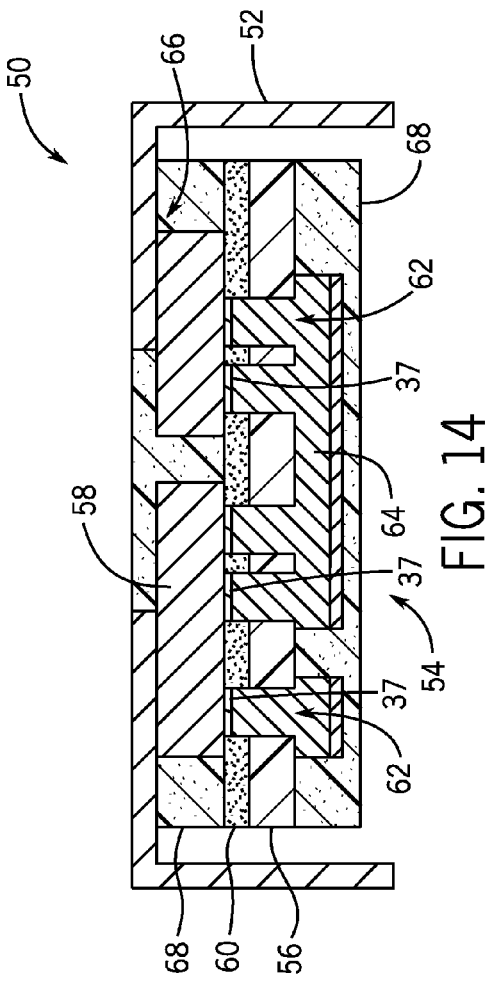
FIG. 14 is a schematic cross-sectional side view of a POL structure according to another embodiment of the invention.

Referring now to FIG. 14, a POL structure 50 is shown according to another embodiment of the invention. As shown in FIG. 13, a leadframe 52 is provided that is attached directly to a POL sub-module 54, without the presence of an intermediate DBC substrate therebetween. The POL sub-module 54 is similar to that of POL sub-module 14 shown in FIG. 9, for example, as it includes a dielectric layer 56 to which semiconductor devices 58 (and when required, shims 58 for vertical electrical or thermal interconnect) are secured by way of an adhesive layer 60. Vias 62 are formed down through dielectric layer 56 to connection pads (not shown) on semiconductor devices/shims 58 and are subsequently metalized to form interconnects 64 having a desired shape, and top side interconnects.

According to the embodiment of POL structure 50 shown in FIG. 14, leadframe 52 is attached directly to a back surface of semiconductor devices 58, such as by way of a solder material 66, with the leadframe 52 being constructed to allow the routing and incorporation of the POL sub-module 54 thereon. After the solder attach of leadframe 52 to semiconductor devices 58, a polymeric underfill, overmold, or encapsulate 68 is provided on POL structure 50 that encapsulates the POL sub-module 54 and a portion of leadframe 52. The polymeric underfill/encapsulate 68 also fills in any gaps in the POL structure 50, thus providing additional structural integrity to the POL structure 50. Alternatively, the material 68 that fills the gap under the POL structure 50 could be different from the overmold/encapsulate 68 around the structure.

Therefore, according to one embodiment of the invention, a power overlay (POL) structure includes a POL sub-module, with the POL sub-module further including a dielectric layer, at least one semiconductor device attached to the dielectric layer that includes a substrate composed of a semiconductor material and a plurality of connection pads formed on the substrate, and a metal interconnect structure electrically coupled to the plurality of connection pads of the at least one semiconductor device, with the metal interconnect structure extending through vias formed through the dielectric layer so as to be connected to the plurality of connection pads. The POL structure also includes a leadframe electrically coupled to the POL sub-module, with the leadframe comprising leads configured to make an interconnection to an external circuit structure.

According to another embodiment of the invention, a power overlay (POL) packaging structure includes a POL sub-module having a dielectric layer, at least one semiconductor device attached to the dielectric layer and including a substrate composed of a semiconductor material and a plurality of connection pads formed on the substrate, and a first level interconnect structure electrically coupled to the plurality of connection pads of the at least one semiconductor device, with the first level interconnect structure extending through vias formed through the dielectric layer so as to be connected to the plurality of connection pads. The POL packaging structure also includes a second level interconnect structure to electrically couple the POL sub-module to an external circuit structure, the second level interconnect structure comprising a leadframe configured to make an interconnection to the external circuit structure.

According to yet another embodiment of the invention, a method of forming a power overlay (POL) structure includes providing a POL sub-module including a dielectric layer, at least one semiconductor device attached to the dielectric layer, and a metallic interconnect structure extending through vias in the dielectric layer to electrically connect to the at least one semiconductor device. The method also includes providing a leadframe for the POL sub-module that is configured to make an interconnection between the POL sub-module and an external circuit structure, wherein the leadframe is electrically coupled to the POL sub-module based on one of a direct attachment of the leadframe to the POL sub-module and an attachment of the leadframe to a direct bond copper (DBC) substrate positioned between the POL sub-module and the leadframe. The method further includes encapsulating the POL sub-module and a portion of the leadframe with a polymeric material to provide structural rigidity to the POL structure.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A power overlay (POL) structure comprising:
a POL sub-module, the POL sub-module comprising:
a dielectric layer having a plurality of vias formed therethrough, the dielectric layer comprising a dielectric lamination or dielectric film;
a plurality of semiconductor devices attached to the dielectric layer, with each of the plurality of semiconductor devices including a plurality of connection pads formed thereon, the plurality of connection pads being formed on a front surface of the semiconductor device; and
a metal interconnect structure electrically coupled to the plurality of connection pads of the plurality of semiconductor devices, the metal interconnect structure extending through the vias formed through the dielectric layer so as to be connected to the plurality of connection pads, with the metal interconnect structure electrically connecting the plurality of semiconductor devices;
a leadframe electrically coupled to the POL sub-module, the leadframe comprising a plurality of leads configured to make an interconnection to an external circuit structure, and wherein the leadframe is attached directly to a back surface of the plurality of semiconductor devices that is opposite the front surface; and
an encapsulate formed about the POL sub-module so as to cover the metal interconnect structure;
wherein the leadframe is constructed to allow the routing and incorporation of the POL sub-module thereon, with the leadframe being electrically coupled to the POL sub-module via the back surface of the plurality of semiconductor devices.

2. The POL structure of claim 1 further comprising a solder material applied to the back surface of the plurality of semiconductor devices to directly attach the leadframe to the at least one semiconductor device.

3. The POL structure of claim 1 wherein the encapsulate fills in any gaps in the POL structure to provide additional structural integrity thereto.

4. The POL structure of claim 1 wherein the POL sub-module is free of wirebond connections.

5. The POL structure of claim 1 further comprising an adhesive layer to secure the plurality of semiconductor devices to the dielectric layer.

6. The POL structure of claim 1 wherein the plurality of leads are configured to surface mount the POL structure to the external circuit.

7. A power overlay (POL) packaging structure comprising:
a POL sub-module, the POL sub-module comprising:
a dielectric layer having a plurality of vias formed therethrough;
a plurality of semiconductors device attached to the dielectric layer, with each of the plurality of semiconductor devices including a plurality of connection pads formed thereon; and
a first level interconnect structure electrically coupled to the plurality of connection pads of the plurality of semiconductor devices to electrically connect the plurality of semiconductor devices, the first level interconnect structure extending through the plurality of vias formed through the dielectric layer so as to be connected to the plurality of connection pads;

a second level interconnect structure to electrically couple the POL sub-module to an external circuit structure, the second level interconnect structure comprising a leadframe configured to make an interconnection to the external circuit structure; and an encapsulate formed on the POL sub-module so as to cover the first level interconnect structure;

wherein the leadframe is affixed directly to the plurality of semiconductor devices of the POL sub-module, the leadframe being attached to the plurality of semiconductor devices on a back side thereof that is opposite the first level interconnect structure, with the leadframe providing an electrical connection to the external circuit structure from the back side of the plurality of semiconductor devices.

8. The POL packaging structure of claim 7 wherein the encapsulate fills in any gaps in the POL packaging structure to provide additional structural integrity thereto.

9. The POL packaging structure of claim 7 wherein the encapsulate comprises a polymeric material.

10. The POL packaging structure of claim 7 further comprising a copper shim configured to provide at least one of a vertical electrical or thermal interconnect in the POL sub-module.

11. The POL packaging structure of claim 7 wherein the POL sub-module is free of wirebond connections.

12. The POL structure of claim 7 wherein the leadframe is constructed to surface mount the POL package structure to the external circuit.

* * * * *